United States Patent [19]

Orlowski et al.

[11] Patent Number: 5,705,415
[45] Date of Patent: Jan. 6, 1998

[54] PROCESS FOR FORMING AN ELECTRICALLY PROGRAMMABLE READ-ONLY MEMORY CELL

[75] Inventors: Marius K. Orlowski; Ko-Min Chang, both of Austin, Tex.

[73] Assignee: Motorola, Inc., Schaumburg, Ill.

[21] Appl. No.: 324,423

[22] Filed: Oct. 4, 1994

[51] Int. Cl.⁶ ............................ H01L 21/8247
[52] U.S. Cl. .................. 437/43; 437/52; 437/203
[58] Field of Search .................... 437/43, 203, 52

[56] References Cited

U.S. PATENT DOCUMENTS

| | | | |
|---|---|---|---|
| 4,713,677 | 12/1987 | Tigelaar et al. | 357/23.5 |
| 4,835,740 | 5/1989 | Baglee | 365/185 |
| 5,017,977 | 5/1991 | Richardson | 357/23.5 |
| 5,049,515 | 9/1991 | Tzeng | 437/43 |
| 5,180,680 | 1/1993 | Yang | 437/38 |
| 5,196,722 | 3/1993 | Bergendahl et al. | 257/304 |
| 5,280,446 | 1/1994 | Ma et al. | 365/185 |
| 5,315,142 | 5/1994 | Acovic et al. | 257/316 |
| 5,338,953 | 8/1994 | Wake | 257/316 |
| 5,382,540 | 1/1995 | Sharma et al. | 437/52 |
| 5,429,969 | 7/1995 | Chang | 437/43 |
| 5,460,988 | 10/1995 | Hong | 437/43 |

FOREIGN PATENT DOCUMENTS 4192565  7/1992  Japan.

OTHER PUBLICATIONS

Pein, et al.; "Performance of the 3–D Sidewall Flash EPROM Cell;" IEDM; pp. 11–14 (1993), month unknown.
Naruke, et al.; "A New Flash–Erase EEPROM Cell With A Sidewall Select–Gate On Its Source Side;" IEDM; pp. 603–606 (1989), month unknown.

*Primary Examiner*—John Niebling
*Assistant Examiner*—Richard A. Booth
*Attorney, Agent, or Firm*—George R. Meyer

[57] ABSTRACT

A semiconductor device is formed having a floating gate memory cell (11) that has its channel region (33) oriented vertically with a portion of the channel region (33) that is not capacitively coupled to a floating gate (32). The memory cell (11) is less likely to be over-erased and may be programmed by source-side injection. The cell (11) may not need to be repaired after erasing. Less power may be consumed during programming compared to hot electron injection and Fowler-Nordheim tunneling.

23 Claims, 6 Drawing Sheets

PROCESS FOR FORMING AN ELECTRICALLY PROGRAMMABLE READ-ONLY MEMORY CELL

FIELD OF THE INVENTION

The present invention relates to semiconductor devices, and in particular, to electrically programmable read-only memory cells.

An electrically erasable and electrically programmable read only memory (EEPROM) cell is a type of nonvolatile memory cell that may be programmed and erased by electronic means. A flash EEPROM memory array includes a plurality of EEPROM cells that is erased during a single erasing operation. Flash EEPROMs are a subset of EEPROMs, and EEPROMs are a subset of electrically programmable read-only memories (EPROMs). During the erasing of a flash EEPROM, some of the memory cells may become over-erased, meaning that the threshold voltage for that memory cell may be negative. In such a case, the memory cell may act as a leakage current source that may increase current consumption by the memory cells during normal operation. To prevent the formation of over-erased cells, an offset is typically built in between the floating gate and either the source region or the channel region of the memory cell. This offset typically is coupled to either a select gate or a merged select/control gate. In essence, this type of cell puts two transistors in series with each other. Traditional EEPROM cells with select gates or merged select/control gates typically occupy a relatively large amount of area because the two transistors are fabricated side by side. Therefore, valuable substrate area is consumed.

Memory cells that have limited power sources (i.e., batteries) may have problems related to processes of programming the cells. More specifically, hot electron injection is a conventional type of programming that consumes a large amount of current during programming. Fowler-Nordheim tunneling typically requires a large potential to be created between a control gate and at least one of a source, drain, or channel region. To reduce power consumption during programming, source side injection may be performed to allow the programming with lower power consumption. Source side injection typically requires a floating gate, control gate, and select gate. In many memory cells, the select gate is formed adjacent to the floating gate and overlies a portion of the channel region that is not covered by the floating gate. Once again, two transistors are being formed side by side with one another and in most cases, these transistors occupy valuable substrate area, thus, reducing potential yield.

SUMMARY OF THE INVENTION

The present invention includes a semiconductor device including an electrically programmable read-only memory cell comprising a semiconductor substrate, a first doped region, a second doped region, a channel region, a floating gate, and a control gate. The semiconductor substrate has a primary surface and a vertical edge adjacent to the primary surface. The first doped region lies adjacent to the vertical edge and is spaced apart from the primary surface. The second doped region lies adjacent to the vertical edge and the primary surface. The channel region lies adjacent to the vertical edge and lies between the first and second doped regions. The floating gate lies adjacent to a first portion of the channel region. The control gate lies adjacent to a second portion of the channel region that is different from the first portion of the channel region. The present invention also includes a process for forming the device.

The present invention also includes a semiconductor device including an electrically programmable read-only memory cell comprising a semiconductor substrate, a first doped region, a second doped region, a channel region, a floating gate, a control gate, and a select gate. The semiconductor substrate has a primary surface and a vertical edge adjacent to the primary surface. The first doped region lies adjacent to the vertical edge and is spaced apart from the primary surface. The second doped region lies adjacent to the vertical edge and the primary surface. The channel region lies adjacent to the vertical edge and lies between the first and second doped regions. The floating gate lies adjacent to a first portion of the channel region. The control gate lies adjacent to the first doped region. The select gate lies adjacent to the control gate and a second portion of the channel region that is different from the first portion of the channel region. The present invention also includes a process for forming the device.

The present invention further includes a semiconductor device including an electrically programmable read-only memory cell comprising a semiconductor substrate, a first doped region, a second doped region, a channel region, a floating gate, a control gate, a third doped region, and a select gate. The semiconductor substrate has a primary surface and a vertical edge adjacent to the primary surface. The first doped region lies adjacent to the vertical edge and is spaced apart from the primary surface. The second doped region lies adjacent to the vertical edge and the primary surface. The channel region lies adjacent to the vertical edge and lies between the first and second doped regions. The floating gate lies adjacent to a first portion of the channel region, wherein the first portion is less than all of the channel region. The control gate lies adjacent to the floating gate but not the channel region. The third doped region lies adjacent to the primary surface and is spaced apart from the second doped region. The select gate lies adjacent to the primary surface, the second doped region, and third doped region. The present invention also includes a process for forming the device.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawing, in which like references indicate similar elements, and in which.

DETAILED DESCRIPTION OF DRAWINGS

A semiconductor device is formed having a floating gate memory cell that is oriented vertically with a portion of a channel region that is not coupled to the floating gate. The memory cell is less likely to be over-erased and may be programmed by source-side injection. The present invention is better understood with the embodiments that are described in more detail below.

MEMORY ARRAY WITH SELECT GATES

Figure 1:
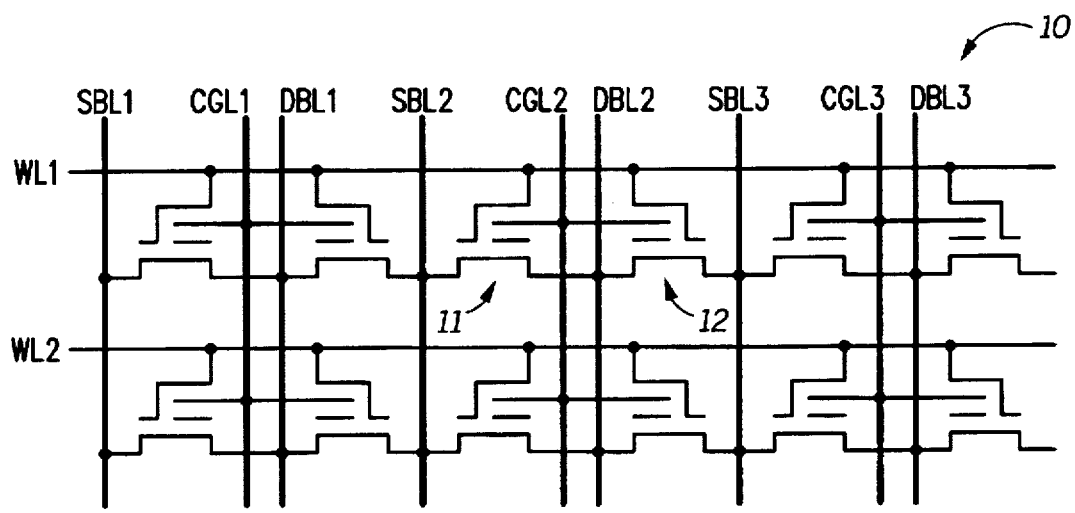
FIG. 1 includes an illustration of a circuit diagram of a portion of a memory array of electrically erasable and electrically programmable read only memory cells.

FIG. 1 includes an illustration of a circuit diagram of a portion of a memory array 10 that includes a plurality of EEPROM cells including EEPROM cell 11 and EEPROM cell 12. The memory array 10 is organized such that source bit lines (SBL1, SBL2, SBL3), drain bit lines (DBL1, DBL2, DBL3), and control gate lines (CGL1, CGL2, CGL3) are oriented from top to bottom in FIG. 1 and are parallel to one another. Word lines (WL1 and WL2) are oriented from side to side in FIG. 1 and are perpendicular to the source bit lines, drain bit lines, and control gate lines.

Figure 2:
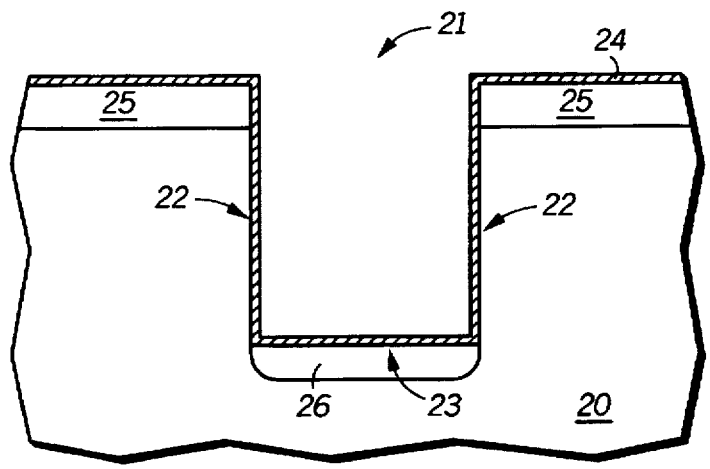
FIG. 2 includes a cross-sectional view of a portion of a semiconductor substrate after forming a trench and doped regions along the top and bottom of the trench.

FIG. 2 includes a cross-sectional view of a portion of a p-type semiconductor substrate 20 at the location for where memory cells 11 and 12 of FIG. 1 will be formed. The substrate 20 is etched to form trenches 21 that typically have depths of no more than one micron. Although one trench 21 is shown in FIG. 2, other trenches similar to trench 21 are formed at other locations along the substrate 20 but are not shown in FIG. 2. Each of the trenches 21 includes vertical edges 22 and a bottom edge 23. An implant screen layer 24 is formed along the exposed surfaces of the substrate 20 including the vertical and bottom edges 22 and 23. The implant screen layer 24 may include a material that may be selectively removed compared to the substrate 20. For example, the implant screen layer 24 may include oxide or nitride. The substrate 20 is then heavily doped to form n-type regions 25 and 26. By heavily doped, it is meant that the dopant concentration for these regions is at least 1E19 atoms per cubic centimeter. The doped regions 25 and 26 form the source and drain regions, respectively, for the memory cells. Although FIG. 2 includes one doped region 26, the memory array 10 includes several other doped regions similar to doped region 26 that lies adjacent to the bottom edge 23 of the trench 21. In the completed device, the doped regions 25 and 26 will have depths typically in a range of 0.05 to 0.30 microns.

Figure 3:
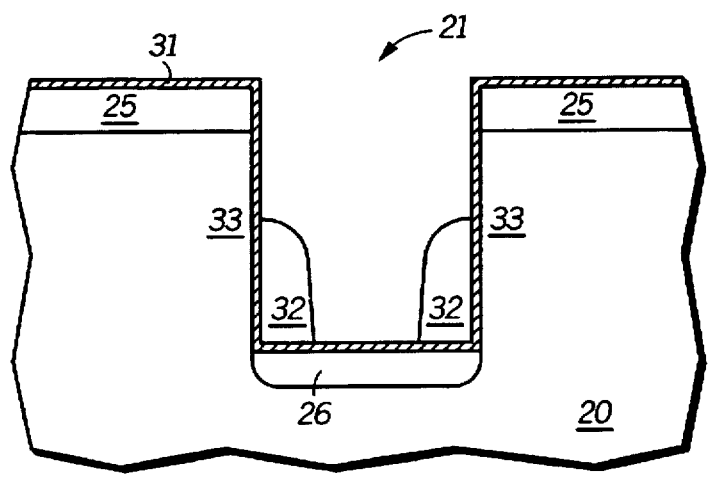
FIG. 3 includes an illustration of the substrate of FIG. 2 after forming floating gates.

The implant screen layer 24 is removed and a gate dielectric layer 31 is formed along the exposed portions of doped regions 25 and 26 and the vertical edges 22 of the trench 21 as shown in FIG. 3. Floating gates 32 are formed along portions of the gate dielectric layer 31 that lie adjacent to the vertical edges of the trench 21. The floating gates 32 may be formed by depositing a doped silicon layer and etching it back to form spacers that lie along the edges of the trenches. The spacers are then patterned into discrete segments that form the floating gates 32. The thickness of the silicon layer is typically in a range of 500–2000 angstroms but should not be so thick that the trench 21 becomes completely filled during deposition. In forming the spacers, the silicon layer is overetched to recess the tops of the spacers from the top of the trench 21. This may be achieved by etching the silicon layer using an endpoint detection to note when the layer has been removed over the doped regions 25 and then using a timed etch for the overetch. The etch to form the spacers should be anisotropic. The spacers are then patterned into discrete segments that form the floating gates 32. The patterning may be performed using an isotropic etch. FIG. 3 does not illustrate the separation between the floating gates but will become apparent in subsequent figures.

Channel regions 33 are those portions of the substrate 20 that lie adjacent to the vertical edges 22 of the trench 21 and lie between the doped regions 25 and 26. As seen in FIG. 3, the floating gates 32 only partially extend up the channel regions 33. At least some gap needs to be maintained between each of the tops of the floating gates 32 and the bottoms of the doped regions 25. As measured vertically, these gaps are typically in a range of 0.05 to 0.45 microns each. Overall, the heights of the floating gates 32 are typically in a range of 50–90 percent of the depths of the trenches 21.

Figure 4:
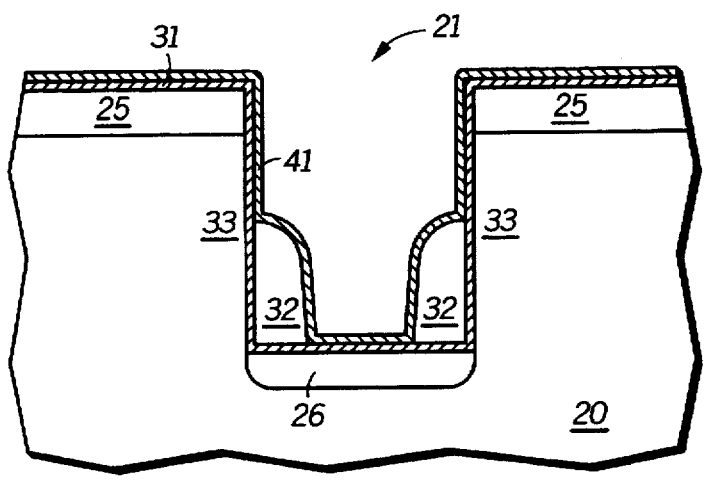
FIG. 4 includes a cross-sectional view of the substrate of FIG. 3 after forming an intergate dielectric layer.

An intergate dielectric layer 41 is then formed along the exposed surfaces of the gate dielectric layer 31 and floating gates 32 as shown in FIG. 4. In one embodiment, the intergate dielectric layer 41 may include a composite of oxide and nitride. Because field isolation regions are subsequently formed, the intergate dielectric layer needs to act as an oxidation mask. The intergate dielectric layer 41 is patterned to remove portions where field isolation regions will be formed.

Figure 5:
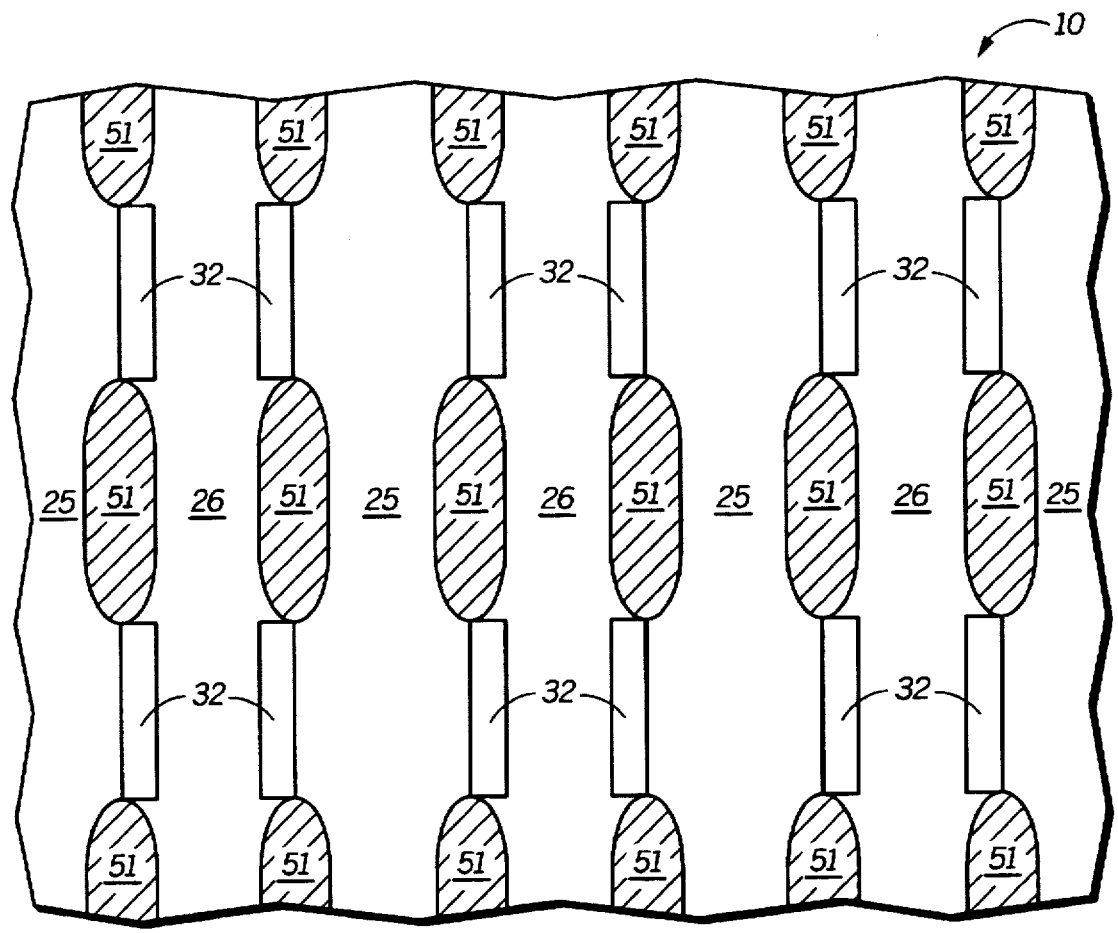
FIG. 5 includes a top view of the substrate of FIG. 4 after forming field isolation regions.

The substrate 20 is thermally oxidized to form field isolation regions 51 as shown in FIG. 5. The thicknesses of the field isolation regions are typically in a range of 1000–3000 angstroms. FIG. 5 includes a top view of the memory array 10 at this point in processing. The dielectric layers 31 and 41 are not shown in any top views in this specification for simplicity. The doped regions 25 and 26 extend along columns oriented from top to bottom in FIG. 5. The doped regions 25 are the source bit lines for the memory array, and the doped regions 26 are the drain bit lines for the memory array. The doped regions 25 are at the top of the trenches, and the doped regions 26 lie along the bottom of the trenches. The floating gates 32 lie along the edges of the trenches and between the field isolation regions 51. The locations of the field isolation regions 51 are at locations where the intergate dielectric layer 41 was removed. Unlike conventional processes, the field isolation regions 51 may be formed after the floating gates 32 are formed. The oxidation to form the field isolation regions 51 oxidizes a portion of the nitride of the intergate dielectric layer 41. Therefore, the intergate dielectric layer 41 is an oxide-nitride-oxide composite and has an electrically measured oxide equivalent thickness and a range of 50–300 angstroms.

Figure 6:
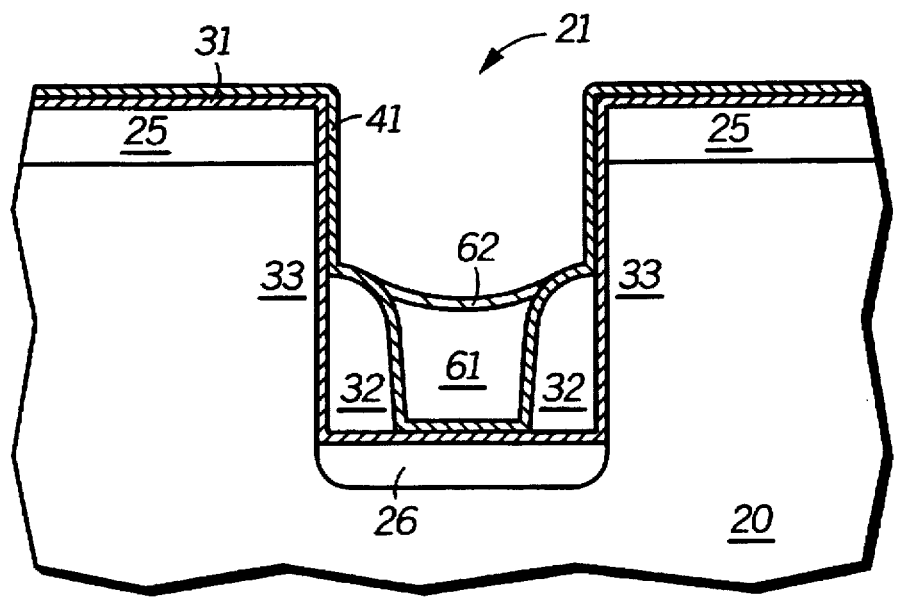
FIG. 6 includes a cross-sectional view of the substrate of FIG. 5 after forming control gate members.

After forming the field isolation regions 51, control gate members 61 are formed that lie adjacent to the doped regions 26 of the memory cells as shown in FIG. 6. Note that the memory array 10 has several control gate members, although one is shown in FIG. 6. The control gate members 61 are the control gate lines for the memory array. The control gate members 61 are formed by depositing a doped silicon layer and etching it back so that the control gate members 61 have a height about the same as the floating gates 32. This portion of the process is similar to the process for forming the spacers from which the floating gates 32 are formed. Unlike the floating gates 32, the trenches may be partially or completely filled, and the control gates are not patterned into discrete segments. The exposed portions of the control gate members 61 are then oxidized to form an insulating layer 62 that insulates the control gate members 61 from subsequently formed select gate members.

Figure 7:
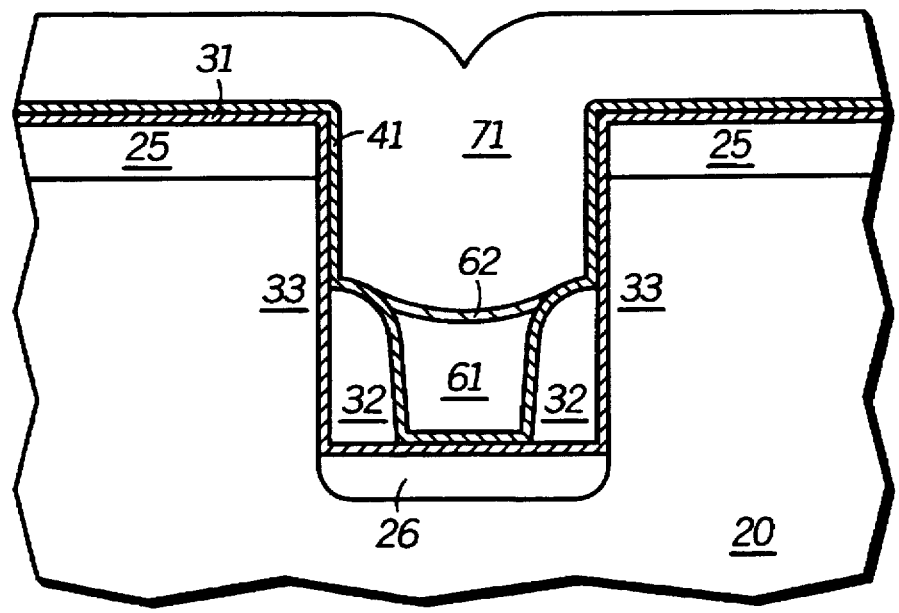
FIG. 7 includes a cross-sectional view of the substrate of FIG. 6 after forming select gate members.
Figure 8:
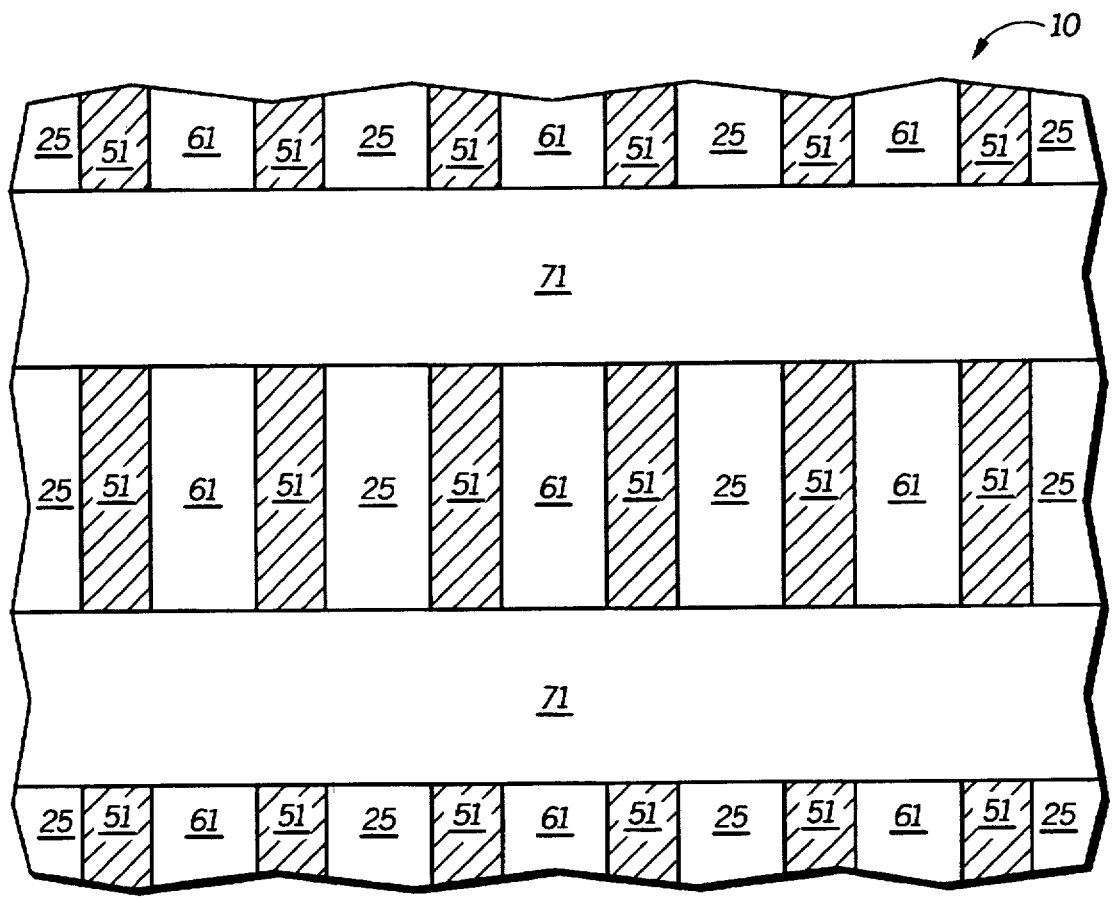
FIG. 8 includes a top view of the substrate of FIG. 7 illustrating positional relationships between various elements of the memory array.

A doped silicon layer is then formed over the intergate dielectric layer 41 and control gate members 61 and is patterned to form select gate members 71 that generally extend from side-to-side as shown in FIGS. 7 and 8. The select gate members 71 are the word lines for the memory array. Also seen within FIG. 8 are the doped regions 25 and the control gate members 61. The doped regions 26 and the floating gates 32 are not seen in FIG. 8 because they are covered by the control gate members 61 or the select gate members 71. For simplicity, the insulating layer 62 is not shown in FIG. 8.

Figure 9:
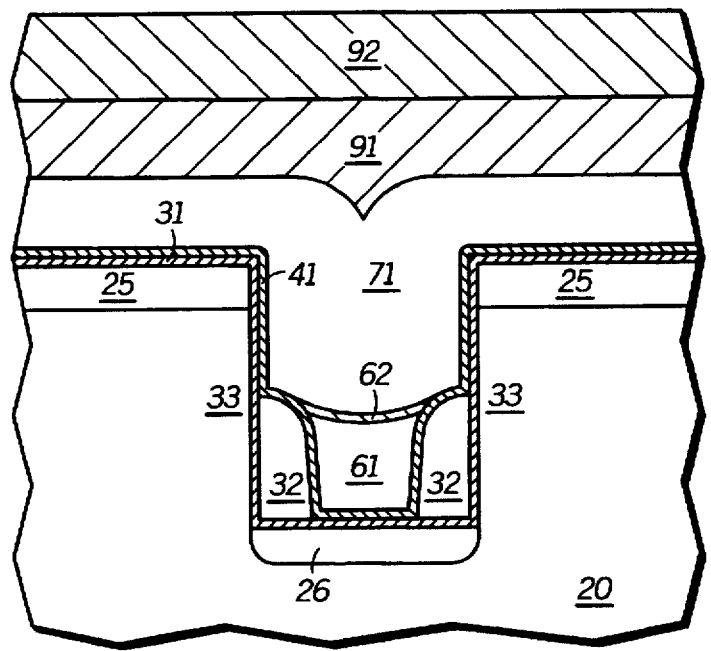
FIG. 9 includes a cross-sectional view of the substrate of FIG. 8 after forming a substantially completed device.

The substrate is further processed to form a substantially completed device as shown in FIG. 9. FIG. 9 includes a glass layer 91 and a passivation layer 92. During the formation of the substantially completed device, contact plugs and interconnects (not shown in FIG. 9) are formed to various regions or members of the memory array to electrically connect those regions or members to row decoders, column decoders, sense amplifiers, or other portions of the device.

Programming, erasing, and reading of the memory cells within memory array 10 may be accomplished in accordance with the table that appears below. Reference should be made to the circuit diagram of FIG. 1. All potentials are expressed in units of volts. VDD is typically in a range of 3.3–5.0 volts but may be as low as 0.9 volts.

potential of about 0 volts. The control gate lines and word lines other than CGL2 and WL1 are at a potential of about 0 volts. In this manner, memory cell 12 should not be programmed because DBL2 and SBL3 are at about the same potential and should virtually prevent any electrons flowing within the channel region 33 of memory cell 12. The potential of CGL2 is about 10 volts and should not be enough to allow tunneling between the channel region 33 and the floating gate 32 of the memory cell 12.

To erase memory cell 11, SBL2 is at a potential of about 0 volts, DBL2 is at a potential of about 5 volts, CGL2 is at a potential of about −10 volts, and WL1 is at a potential of about 0 volts. Electrons tunnel from the floating gate 32 to the doped region 26 that is part of DBL2 for memory cell 11. The other source and drain bit lines are at a potential of about 0 volts. The other control gate and word lines are at a potential of about 0 volts. Memory cell 11 should not become over-erased because a portion of the channel region 33 is not capacitively coupled to the floating gate 32. Therefore, a separate repair step after erasing may not be needed.

To read memory cell 11, SBL2 is at a potential of about 0 volts, DBL2 is at a potential of about VDD, and CGL2 is at about the same potential as VDD. While memory cell 11 is being read, memory cell 12 should not be read because DBL2 and SBL3 are at about same potential. Therefore, virtually no electrons flow within the channel region of memory cell 12. The other bit lines to the left of the memory cell are at a potential of about 0 volts, and the other bit lines that are to the right of the memory cell 11 are at about the same potential as VDD. The other control gates and word lines are at about 0 volts.

ALTERNATIVE MEMORY CELLS

In one alternate embodiment, the select gate and control gate members may be replaced by merged select/control

TABLE 1

| | | | | | Operating Potentials | | | | | |
|---|---|---|---|---|---|---|---|---|---|---|
| Operation | DBL < 2 SBL < 2 | SBL2 | DBL2 | SBL3 | DBL > 2 SBL > 3 | CGL < 2 | CGL2 | CGL > 2 | WL < 1 | WL1 | WL > 1 |
| Program | 0 | 0 | 5 | 5 | VDD | 0 | 10 | 0 | 0 | 1.2 | 0 |
| Erase | 0 | 0 | 5 | 0 | 0 | 0 | −10 | 0 | 0 | 0 | 0 |
| Read 11 | 0 | 0 | VDD | VDD | VDD | 0 | VDD | 0 | 0 | VDD | 0 |
| Read 12 | VDD | VDD | VDD | 0 | 0 | 0 | VDD | 0 | 0 | VDD | 0 |

Figure 10:
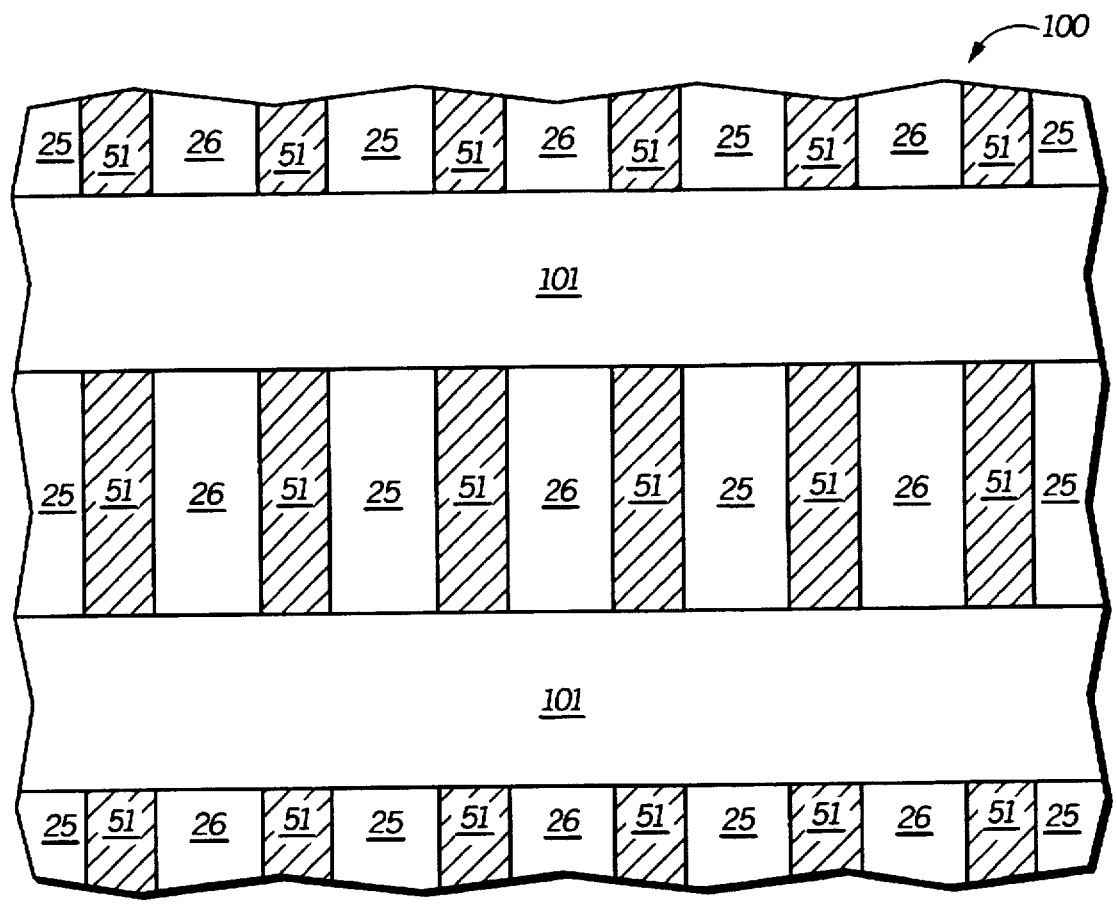
FIG. 10 includes a top view of a portion of a memory array in accordance with another embodiment in which the select gate members are replaced by control gate members.
Figure 11:
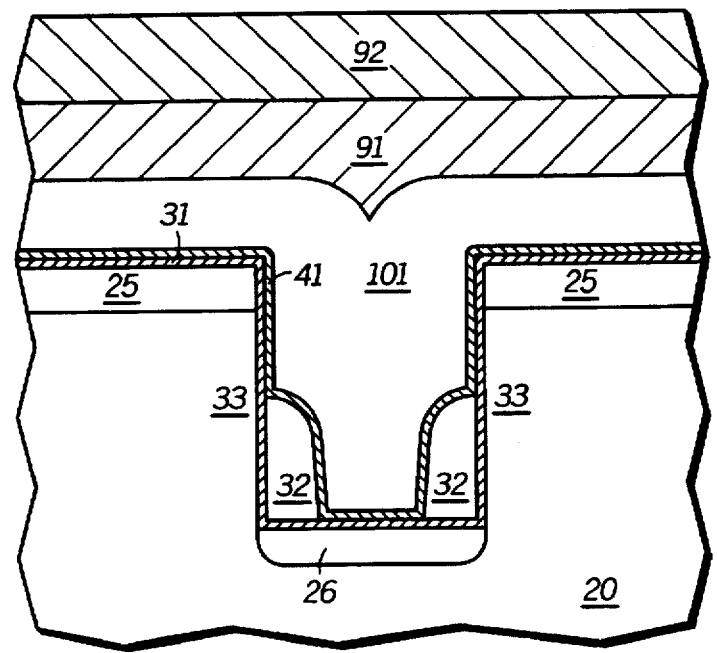
FIG. 11 includes a cross-sectional view of a portion of FIG. 10 illustrating the control gate members in relation to other portions of the device.

The programming potentials in Table 1 are used to program only memory cell 11 by source-side injection. SBL2 is at a potential of about 0 volts, DBL2 is at a potential of about 5 volts, CGL2 is at a potential of about 10 volts, and WL1 is at a potential of about 1.2 volts. Note that the portion of the channel region 33 that is adjacent to the select gate member 71 is weakly inverted and relatively resistive compared to the rest of the channel region 33. A relatively high electric field is formed within the channel region 33 near the edges of the floating gate 32 and select gate member 71. Of the change in potential along the channel region 33, no more than 10 percent of the change in potential is associated with the portion of the channel region 33 adjacent to the floating gate 32. In order to prevent programming of other cells, the potentials of the other source bit lines, drain bit lines, and word lines are adjusted so that only memory cell 11 is programmed. For example, all of the source bit lines and drain bit lines to the left of and not electrically connected to the memory cell 11 in FIG. 1 (DBL<2 and SBL<2) are at a gate members as shown in FIGS. 10 and 11. The merged select/control gate is a type of a select gate and a type of control gate. FIG. 10 includes a top view of a portion of a memory array 100, and FIG. 11 includes a cross-sectional view of a portion of the memory array 100. The process for forming the semiconductor device of this embodiment is substantially the same as the previous embodiment to the point just before the control gates 61 are formed. In this embodiment, a doped silicon layer is formed within the trenches so that the trenches are filled. The silicon layer is then patterned into merged select/control gate members 101 that are strips that extend from side to side in FIGS. 10 and 11. The portions of the members 101 that are capacitively coupled to the floating gates 32 are the control gates, and the portions of the members 101 that are capacitively coupled to the channel regions 33 are the select gates. The steps after forming the select gate members 71 of the previous embodiment are then performed to form a substantially completed device. Note that the members 101 do not lie along the entire length of the trenches. Therefore, portions of the doped regions 26 are not covered by the members 101. The lengths of the members 101 are perpendicular to the lengths of the doped regions 25 and 26.

Figure 12:
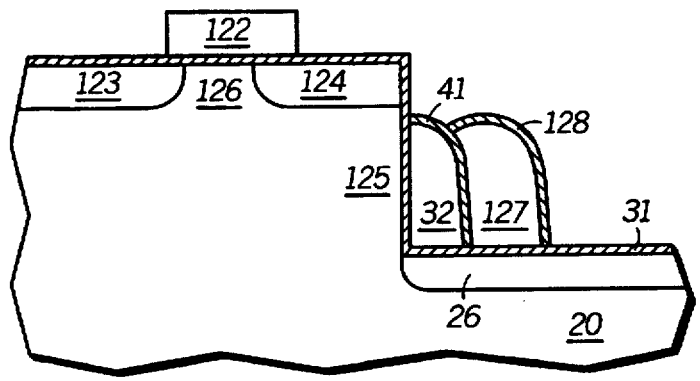
FIGS. 12 through 15 include cross-sectional views of portions of semiconductor substrates of EEPROM cells formed in accordance with alternate embodiments.
Figure 13:
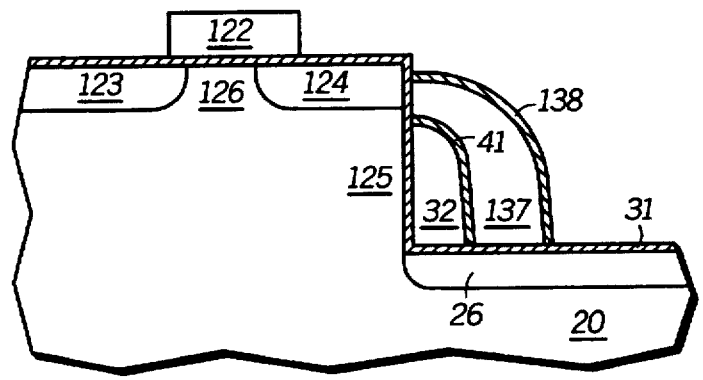

In other embodiments, the select gate member may be formed over a portion of the substrate spaced apart from the trench. Referring to FIGS. 12 and 13, the select gate member 122 overlies a portion of a channel region 126 and doped regions 123 and 124. A channel region 125 is formed and is similar to the channel regions 33 in a previous embodiment. In this particular embodiment, the floating gate, the doped region 26, the gate dielectric region 31, floating gate 32, and intergate dielectric layer 41 are formed similar to the previous embodiment. Referring to FIG. 12 the control gate 127 and insulating layer 128 are formed in a manner somewhat similar to the previous embodiment. In this particular embodiment a select gate may be formed after the control gate member has been formed followed by a doping step to form doped regions 123 and 124 that are self-aligned to the select gate member 122. Note that the channel region 125 is adjacent to the floating gate 32 but a portion of the channel region 125 is not adjacent to the floating gate 32, control gate member 127, or select gate member 122. The portion acts as a resistive section that would allow a relatively high electric field to be formed. FIG. 13 illustrates a different embodiment that has a merged select/control gate member 137 and an insulating layer 138.

Figure 14:
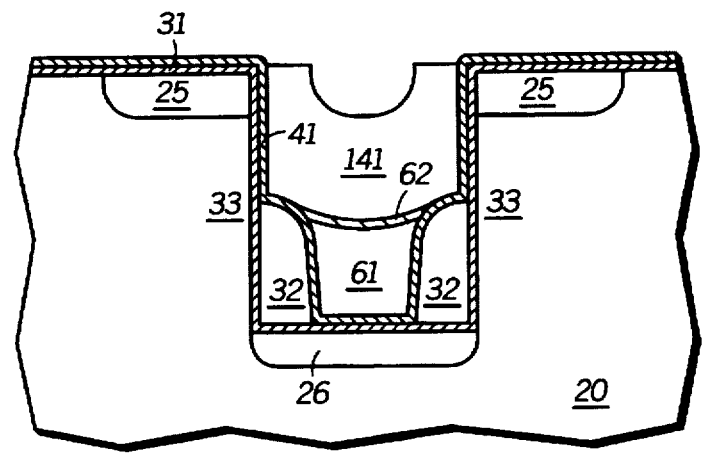
Figure 15:
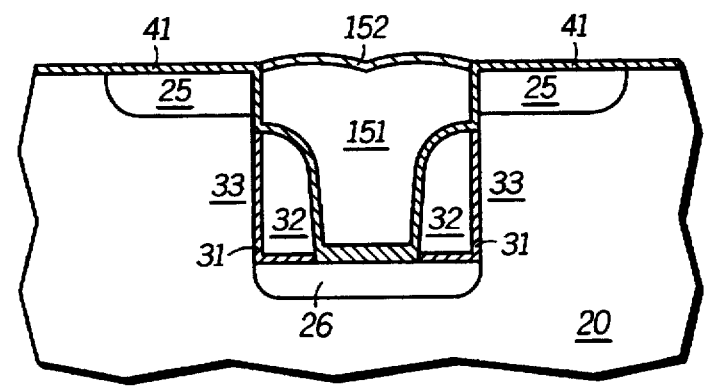

In still other embodiments the select gate or merged select/control gate may be formed completely within a trench. Referring to FIG. 14, the select gate member 141 lies completely within the trench, and referring to FIG. 15, the merged select/control gate member 151 lies completely within the trench.

PROCESSING OPTIONS

The trench 21 formed in the first embodiment may be formed by a deposition or selective epitaxy. More specifically, a patterned insulating layer may be formed over a wafer. The patterned insulating layer includes openings where semiconductor pillars would be formed. A deposition or selected epitaxy step would then be performed to fill up the openings to create pillars. After forming the pillars, the insulating layer is removed. In this manner, the locations where the insulating layer was located during the deposition or epitaxy step would correspond to the trench regions 21 in the previous embodiments. Within this specification, the combination of the wafer and pillars is a substrate.

In an alternate embodiment, the doped regions 25 and 26 may be formed at a different time. More specifically, the doped region 25 may be formed prior to forming the trench 21, or the doped region 25 could be formed after forming the control gate member. Similarly, doped region 26 could be incorporated as a part of an n-type buried layer and be patterned such that it is as least as wide as the trench to be formed.

In still other alternative embodiments, the gate dielectric layer may include oxide, nitride, or a nitrided oxide. This layer may be thermally grown, deposited, or a combination of the two. Gate dielectric layer 31 typically has a thickness no greater than 500 angstroms, and, if tunneling is used for programming or erasing, it is typically less than 150 angstroms thick. The intergate dielectric layer 41 may be formed using methods similar to those used to form the gate dielectric layer 31.

In yet another embodiment, the implant screen layer 24 may be used as a gate dielectric layer. In this embodiment, the implant screen layer 24 is not removed after forming doped regions 25 and 26. After the doped regions 25 and 26 are formed, the floating gates 32 are formed adjacent to the implant screen layer 24 that also acts as the gate dielectric layer. In this manner, one processing step may be eliminated. The thickness of the implant screen layer 24 should be in a range of thicknesses typically used for a gate dielectric layer as listed in the previous paragraph.

The floating gates 32, control gate members 61 and 137, select gate members 71 and 122, and the merged control/select gate members 101, 137, and 151 are formed from a doped semiconductor layer or a metal-containing layer. The insulating layers 62, 128, 138, and 152 may include thermal oxide or a nitrided compound.

Although no interconnects and contacts are shown within the figures, they are typically formed near the edge of the memory array. If the device being formed is complicated and requires other levels of interconnects, then additional glass layers similar to glass layer 91, via plugs, and interconnect layers (not shown) may be formed. Those skilled in the art know how to form these additional layers and via plugs.

BENEFITS

The memory cell is formed in a vertical direction that allows a smaller cell size to be achieved. The gap in the channel region between the floating gate 32 and the source region 26 allows the memory array to be erased with less of a chance of forming an over-erased cell compared to a memory cell, wherein the floating gate spans the entire channel region. Therefore, a repairing step after erasing may not be needed. Some of the embodiments form memory cells that may be programmed by source-side injection that uses relatively less power compared to conventional hot electron injection and Fowler-Nordheim tunneling. The memory cells also are formed such that they should not have write disturb or read disturb problems. In forming the memory cells, the integration of vertical components with relatively complicated structures has been achieved.

In the foregoing specification, the invention has been described with reference to specific embodiments thereof. However, it will be evident that various modifications and changes can be made thereto without departing from the broader spirit or scope of the invention as set forth in the appended claims. Accordingly, the specification and drawings are to be regarded in an illustrative rather than a restrictive sense.

What is claimed is:

1. A process for forming a semiconductor device including an electrically programmable read-only memory cell comprising the steps of:

forming a vertical edge adjacent to a primary surface of a semiconductor substrate;

forming a first doped region and a second doped region, wherein:

the first doped region lies adjacent to the vertical edge and spaced apart from the primary surface;

the second doped region lies adjacent to the vertical edge and the primary surface, wherein a bottom of the second doped region at the vertical edge lies at a first elevation; and a channel region adjacent to the vertical edge that lies between the first and second doped regions, wherein the channel region includes a first portion adjacent to the first doped region and a second portion adjacent to the second doped region;

forming a floating gate adjacent to the first portion of the channel region, wherein:

the floating gate has a highest point adjacent to the vertical edge; and the highest point lies at a second elevation that is lower than and spaced apart from the first elevation; and the step of forming the floating gate is performed after the step of forming the vertical edge;

forming a control gate adjacent to the first doped region; and forming a select gate adjacent to the control gate and the second portion of the channel region.

2. The process of claim 1, wherein the first doped region and the second doped region are formed during separate steps.

3. The process of claim 1, wherein:

another electrically programmable read-only memory cell is formed during the process and includes a different vertical edge and a different floating gate;

the step of forming the vertical edge is performed such that both the first mentioned vertical edge and the different vertical edge are part of a trench; and the step of forming the floating gate is performed such that the floating gates lie within the trench.

4. A process for forming a semiconductor device including an electrically programmable read-only memory cell comprising the steps of:

forming a vertical edge adjacent to a primary surface of a semiconductor substrate;

forming a first doped region, a second doped region and a third doped region, wherein:

the first doped region lies adjacent to the vertical edge and spaced apart from the primary surface;

the second doped region lies adjacent to the vertical edge and the primary surface, wherein a bottom of the second doped region at the vertical edge lies at a first elevation;

a channel region adjacent to the vertical edge and lies between the first and second doped regions, wherein the channel region includes a first portion adjacent to the first doped region and a second portion adjacent to the second doped region; and the third doped region lies adjacent to the primary surface and is spaced apart from the second doped region;

forming a floating gate adjacent to the first portion of the channel region, wherein:

the floating gate has a highest point adjacent to the vertical edge; and the highest point lies at a second elevation that is lower than and spaced apart from the first elevation; and the step of forming the floating gate is performed after the step of forming the vertical edge;

forming a control gate adjacent to the floating gate; and forming a select gate adjacent to the primary surface, the second doped region, and third doped region.

5. The process of claim 4, further comprising a step of forming a field isolation region, wherein said step is performed after the step of forming the floating gate.

6. The process of claim 4, wherein:

another electrically programmable read-only memory cell is formed during the process and includes a different vertical edge and a different floating gate;

the step of forming both vertical edges is performed such that the first mentioned vertical edge and the different vertical edge define sides of a trench; and the step of forming the floating gate is performed such that the first mentioned floating gate and the different floating gate lie within the trench.

7. The process of claim 4, wherein the step of forming the vertical edge is performed by etching a trench into the substrate to a depth no greater than one micron.

8. The process of claim 4, wherein:

the step of forming the vertical edge includes a step of etching a trench into the semiconductor substrate; and the step of forming the floating gate includes steps of:

depositing a semiconductor material within the trench; and etching the semiconductor material to form a spacer that defines the floating gate.

9. The process of claim 4, further comprising a step of forming a field isolation region along the vertical edge and adjacent to the floating gate.

10. The process of claim 4, wherein the step of forming the floating gate is performed such that the floating gate has a height that is in a range of 50–90 percent of a height of the vertical edge.

11. The process of claim 4, wherein the steps of forming the floating gate and forming the first and second doped regions are performed such that a difference between the first and second elevations is in a range of 0.05–0.45 microns.

12. The process of claim 4, wherein the steps of forming the vertical edge and forming the select gate are performed such that the vertical edge has a length that extends in a first direction and the select gate has a length that also extends in the first direction.

13. The process of claim 1, wherein the steps of forming the vertical edge and forming the select gate are performed such that the vertical edge has a length that extends in a first direction, the select gate has a length that extends in a second direction that is perpendicular to the first direction.

14. The process of claim 1, wherein the step of forming the vertical edge is performed by etching a trench into the substrate to a depth no greater than one micron.

15. The process of claim 14, wherein the steps of forming the floating gate and the control gate are performed such that the floating gate and the control gate lie completely within the trench.

16. The process of claim 15, wherein the step of forming the select gate is performed such that the select gate lies completely within the trench.

17. The process of claim 1, wherein:

the step of forming the vertical edge includes a step of etching a trench into the semiconductor substrate; and the step of forming the floating gate includes steps of:

depositing a semiconductor material within the trench; and etching the semiconductor material to form a spacer that defines the floating gate.

18. The process of claim 1, further comprising a step of forming a field isolation region along the vertical edge and adjacent to the floating gate.

19. The process of claim 1, wherein the step of forming the floating gate is performed such that the floating gate has a height that is in a range of 50–90 percent of a height of the vertical edge.

20. The process of claim 1, wherein the steps of forming the floating gate and the first and second doped regions are performed such that a difference between the first and second elevations is in a range of 0.05–0.45 microns.

21. A process for forming a semiconductor device including an electrically programmable read-only memory cell comprising the steps of:

forming a vertical edge adjacent to a primary surface of a semiconductor substrate;

forming a first doped region, a second doped region and a third doped region, wherein:
    the first doped region lies adjacent to the vertical edge and spaced apart from the primary surface;
    the second doped region lies adjacent to the vertical edge and the primary surface;
    a channel region adjacent to the vertical edge and lies between the first and second doped regions; and
    the third doped region lies adjacent to the primary surface and is spaced apart from the second doped region;
forming a floating gate adjacent to a first portion of the channel region, wherein the first portion is less than all of the channel region;
forming a field isolation region after the step of forming the floating gate;
forming a control gate adjacent to the floating gate but not the channel region; and
forming a select gate adjacent to the primary surface, the second doped region, and third doped region.

22. A process for forming a semiconductor device including an electrically programmable read-only memory cell comprising the steps of:
    forming a vertical edge adjacent to a primary surface of a semiconductor substrate;
    forming a first doped region, a second doped region and a third doped region, wherein:
        the first doped region lies adjacent to the vertical edge and spaced apart from the primary surface;
        the second doped region lies adjacent to the vertical edge and the primary surface;
        a channel region adjacent to the vertical edge and lies between the first and second doped regions; and
        the third doped region lies adjacent to the primary surface and is spaced apart from the second doped region;
    forming a floating gate adjacent to a first portion of the channel region, wherein the first portion is less than all of the channel region;
    forming a field isolation region along the vertical edge and adjacent to the floating gate;
    forming a control gate adjacent to the floating gate but not the channel region; and
    forming a select gate adjacent to the primary surface, the second doped region, and third doped region.

23. A process for forming a semiconductor device including an electrically programmable read-only memory cell comprising the steps of:
    forming a vertical edge adjacent to a primary surface of a semiconductor substrate;
    forming a first doped region and a second doped region, wherein:
        the first doped region lies adjacent to the vertical edge and spaced apart from the primary surface;
        the second doped region lies adjacent to the vertical edge and the primary surface; and
        a channel region adjacent to the vertical edge and lies between the first and second doped regions;
    forming a floating gate adjacent to a first portion of the channel region;
    forming a field isolation region along the vertical edge and adjacent to the floating gate;
    forming a control gate adjacent to the first doped region; and
    forming a select gate adjacent to:
        the control gate; and
        a second portion of the channel region that is different from the first portion of the channel region.

* * * * *